United States Patent [19]

Ide

[11] Patent Number: 5,603,772
[45] Date of Patent: Feb. 18, 1997

[54] FURNACE EQUIPPED WITH INDEPENDENTLY CONTROLLABLE HEATER ELEMENTS FOR UNIFORMLY HEATING SEMICONDUCTOR WAFERS

[75] Inventor: Shigeaki Ide, Kumamoto, Japan

[73] Assignee: NEC Corporation, Japan

[21] Appl. No.: 514,242

[22] Filed: Aug. 11, 1995

[30] Foreign Application Priority Data

Aug. 16, 1994 [JP] Japan ................................. 6-192609

[51] Int. Cl.$^6$ ................................................. C23C 11/00
[52] U.S. Cl. ...................... 118/724; 118/728; 118/500; 118/666; 219/390; 219/411; 392/416
[58] Field of Search .................................... 118/724, 725, 118/728, 500, 666; 432/5, 6, 156, 241, 251; 219/390, 405, 411; 392/416, 418

[56] References Cited

U.S. PATENT DOCUMENTS

| Re. 33,326 | 9/1990 | Ebata | 118/697 |
|---|---|---|---|
| 3,311,694 | 3/1967 | Lasch | 13/24 |
| 3,385,921 | 5/1968 | Hampton | 13/24 |
| 3,658,032 | 4/1972 | Kohler | 118/48 |
| 4,061,870 | 12/1977 | Mizushina | 13/24 |
| 4,738,618 | 4/1988 | Massey | 432/241 |
| 4,753,192 | 6/1988 | Goldsmith | 118/725 |
| 4,761,538 | 8/1988 | Chiba | 219/497 |
| 4,802,441 | 2/1989 | Waugh | 118/666 |
| 4,886,954 | 12/1989 | Yu | 219/390 |
| 5,001,327 | 3/1991 | Hirasawa | 219/390 |
| 5,029,554 | 7/1991 | Miyashita | 118/715 |
| 5,128,515 | 7/1992 | Tanaka | 219/390 |
| 5,171,972 | 12/1992 | Hidano | 219/390 |
| 5,256,566 | 10/1993 | Bailey | 437/233 |
| 5,273,424 | 12/1993 | Kobayashi | 432/241 |
| 5,288,364 | 2/1994 | Burt | 156/601 |
| 5,380,553 | 1/1995 | Loboda | 427/226 |

FOREIGN PATENT DOCUMENTS

| 58-135636 | 8/1983 | Japan . | |
|---|---|---|---|
| 62-291115 | 12/1987 | Japan | 118/724 |
| 218928 | 2/1988 | Japan | H01L 21/22 |
| 01-30215 | 2/1989 | Japan . | |
| 1-276634 | 11/1989 | Japan | 118/724 |
| 2137221 | 5/1990 | Japan | H01L 21/22 |
| 3-64912 | 3/1991 | Japan | 118/725 |
| 6-61158 | 3/1994 | Japan . | |

*Primary Examiner*—Robert Kunemund
*Assistant Examiner*—Jeffrie R. Lund
*Attorney, Agent, or Firm*—Hayes, Soloway, Hennessey, Grossman & Hage, P.C.

[57] ABSTRACT

A furnace available for diffusion and oxidation is equipped with a plurality of groups of temperature sensors monitoring respective zones heated by associated heater elements, and a plurality of controller vary electric currents supplied to the heater elements so as to create a uniform temperature distribution around semiconductor wafers.

7 Claims, 4 Drawing Sheets

FURNACE EQUIPPED WITH INDEPENDENTLY CONTROLLABLE HEATER ELEMENTS FOR UNIFORMLY HEATING SEMICONDUCTOR WAFERS

FIELD OF THE INVENTION

This invention relates to a furnace available for diffusion of dopant impurity or oxidation in a semiconductor fabrication process and, more particularly, to a horizontal furnace equipped with a plurality of independently controllable heater elements for uniformly heating semiconductor wafers.

DESCRIPTION OF THE RELATED ART

While semiconductor integrated circuit devices are being fabricated on a semiconductor wafer, the semiconductor wafer is partially oxidized, and a dopant impurity is selectively diffused into the semiconductor wafer or semiconductor layers deposited over the semiconductor wafer. The diffusion and the oxidation are usually carried out in a furnace, and a uniform temperature distribution is the fundamental requirement to the diffusion/oxidation furnace. Thus, the temperature is one of the major factors in the diffusion process and the oxidation process. In fact, gate oxide films of field effect transistors and dielectric films of capacitors are getting thinner and thinner, and a small amount of irregularity strongly affects the device characteristics. If the oxidation is carried out at different temperatures, the irregularity of the gate oxide films exceeds the allowable range. Similarly, the diffusion is sometimes expected to form shallow junctions for miniature circuit components, and allowed irregularity is also extremely small. Miniaturization requires uniform temperature distribution. Thus, uniform temperature distribution is very important for the diffusion/oxidation process.

A major cause of a given temperature distribution in a furnace is heat radiation through the convection phenomenon generated in furnace chamber. The influence of the convection is experienced as follows. First, after developing a vacuum in a furnace chamber, the furnace chamber is uniformly heated to 800 degrees centigrade, by way of example. If the vacuum is broken, the furnace chamber is decreased by 20 degrees centigrade in the normal pressure.

Although the vacuum is effective against the non-uniformity, diffusion and oxidation can not carried out in a vacuum at all times, and improvements have been proposed.

One of the improvements is disclosed in Japanese Patent Publication of Unexamined Application No. 2-137221. FIGS. 1 and 2 illustrate the diffusion furnace disclosed in the Japanese Patent Publication of Unexamined Application. The diffusion furnace largely comprises a concentric tubular structure 1, a main heater unit 2 and an auxiliary heater unit 3.

The concentric tubular structure 1 includes an outer tube 1a, a heat-insulating tube 1b inserted into the outer tube 1a and a furnace tube 1c provided inside of the heat-insulating tube 1b. A tubular space 1d is formed between the heat-insulating tube 1b and the furnace tube 1c, and the main heater unit 2 spirals on the outer surface of the furnace tube 1c. A pair of terminals 2a/2b is connected to the main heater unit 2, and projects from the concentric tubular structure 1.

The auxiliary heater unit 3 is provided in the bottom portion of the tubular space 1d, and a pair of terminals 3a/3b is connected to the auxiliary heater unit 3.

When electric current flows between the terminals 2a and 2b, the main heater unit 2 generates heat, and the heat is transferred through the furnace tube to the inner space 1e of the furnace tube 1c. The furnace tube 1c is firstly heated, and the furnace tube 1c heats the inner space 1e. An upper zone of the inner space 1e tends to be higher in temperature than a bottom zone due to the convection phenomenon. However, if the auxiliary heater unit 3 is energized, the heat supplied from the auxiliary heater unit 3 is non-uniformly added to the heat supplied from the main heater unit 2, and the heat supplied to the bottom zone is more than the heat supplied to the upper zone. As a result, the temperature distribution is partially compensated.

Another diffusion furnace is disclosed in Japanese Patent Publication of Unexamined Application No. 2-18928, and FIG. 3 illustrates the diffusion furnace disclosed in the Japanese Patent Publication of Unexamined Application. The diffusion furnace comprises a furnace tube 5, a main heater unit 6 and sub-heaters 7a and 7b, and semiconductor wafers 8 are inserted into an inner space 5a of the furnace tube 5.

The main heater spirals on the outer surface of the furnace tube 5, and uniformly heats the furnace tube 5. The inner space 5a and, accordingly, the semiconductor wafers 8 are indirectly heated through the furnace tube 5, and a temperature difference tends to take place between an upper zone and a lower zone of the inner space 5a.

Thermo-couples 9a and 9b are inserted into the upper zone and the lower zone of the inner space 5a, respectively, and respectively monitor the temperature of the upper zone and the temperature of the lower zone. The thermo-couples 9a and 9b are connected to a controller 10, and the controller 10 regulates the current to the sub-heater 7a and the current to the other sub-heater depending upon the temperature difference reported from the thermo-couples 7a and 7b.

Thus, the sub-heaters 7a and 7b are independently controlled by the controller 10, and the temperature difference is decreased through the two feed-back loops, i.e., the thermo-couple 9a/the controller 10/the sub-heater 7a and the other thermo-couple 9b/the controller 10/the other sub-heater 7b. The temperature difference between the upper zone and the lower zone in the furnace tube 5a is smaller than the temperature difference between the upper zone and the bottom zone in the furnace tube 1e.

However, the prior art diffusion furnace disclosed in Japanese Patent Publication of Unexamined Application No. 2-18928 can not make oxide films and impurity profiles strictly uniform, and is not suitable for an ultra large scale integration of the next generation.

SUMMARY OF THE INVENTION

It is therefore an important object of the present invention to provide a furnace which uniformly forms oxide films and impurity profiles regardless of zones in the furnace tube.

To accomplish this object, the present invention proposes to directly monitor a temperature distribution around semiconductor wafers in a furnace tube.

In accordance with one aspect of the present invention, there is provided a diffusion furnace comprising: a furnace tube horizontally placed, and accommodating a boat for supporting a plurality of semiconductor wafers; a plurality of heater elements provided in such a manner as to surround an outer peripheral of the furnace tube; a plurality of power supply units respectively supplying electric currents to the plurality of heater elements; a plurality of temperature sensors provided in an inner space of the furnace tube and associated with the plurality of heater elements, respectively; and a plurality of controllers of a proportional band-integral time-derivative time type responsive to temperature signals respectively supplied from the plurality of temperature sensors so as to independently control the electric currents supplied from the plurality of power supply units to the plurality of heater elements, thereby matching actual temperatures around the plurality of temperature sensors with a target temperature.

In accordance with another aspect of the present invention, there is provided a furnace comprising: a furnace tube encircling an inner space in a first direction and accommodating a plurality of semiconductor wafers moved into and out of the inner space in a second direction; a plurality of temperature sensor groups provided in the inner space and arranged in the second direction, each of the temperature sensor groups having a plurality of temperature sensors arranged in the first direction around the plurality of semiconductor wafers for generating detecting signals indicative of actual temperatures around the plurality of semiconductor wafers; a plurality of heater groups provided outside of the furnace wall and arranged in the second direction, each of the plurality of heater groups having a plurality of heater elements arranged in the first direction around the furnace wall for supplying heat through the furnace wall to the inner space; and a plurality of current controlling means associated with the respective plurality of heater groups and the respective plurality of temperature sensor groups, each of the plurality of current controlling means having a plurality of current controlling sub-means respectively responsive to the detecting signals supplied from the plurality of temperature sensors of the associated temperature sensor group so as to regulate electric currents respectively supplied to the plurality of heater elements of the associated heater group, thereby matching the actual temperatures to a target temperature for creating a uniform temperature distribution around the plurality of semiconductor wafers.

BRIEF DESCRIPTION OF THE DRAWINGS

The features and advantages of the furnace according to the present invention will be more clearly understood from the following description taken in conjunction with the accompanying drawings in which.

DESCRIPTION OF THE PREFERRED EMBODIMENTS

First Embodiment

Figure 1:
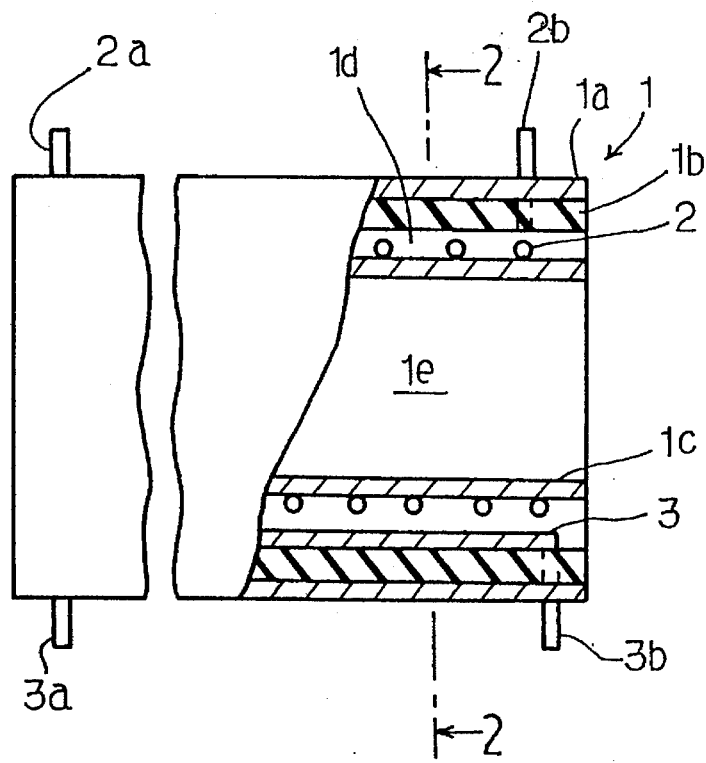
FIG. 1 is a partially cut-away front view showing the prior art diffusion furnace disclosed in Japanese Patent Publication of Unexamined Application No 2-137221.
Figure 2:
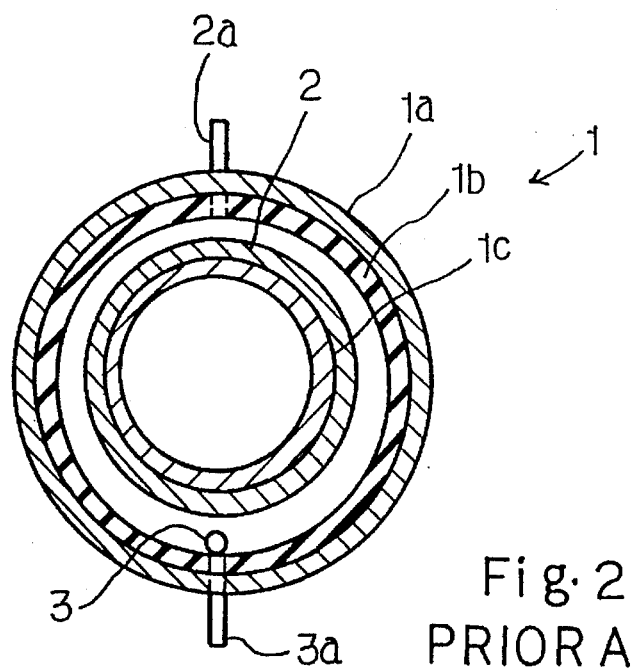
FIG. 2 is a cross sectional view taken along line 2—2 of FIG. 1.
Figure 3:
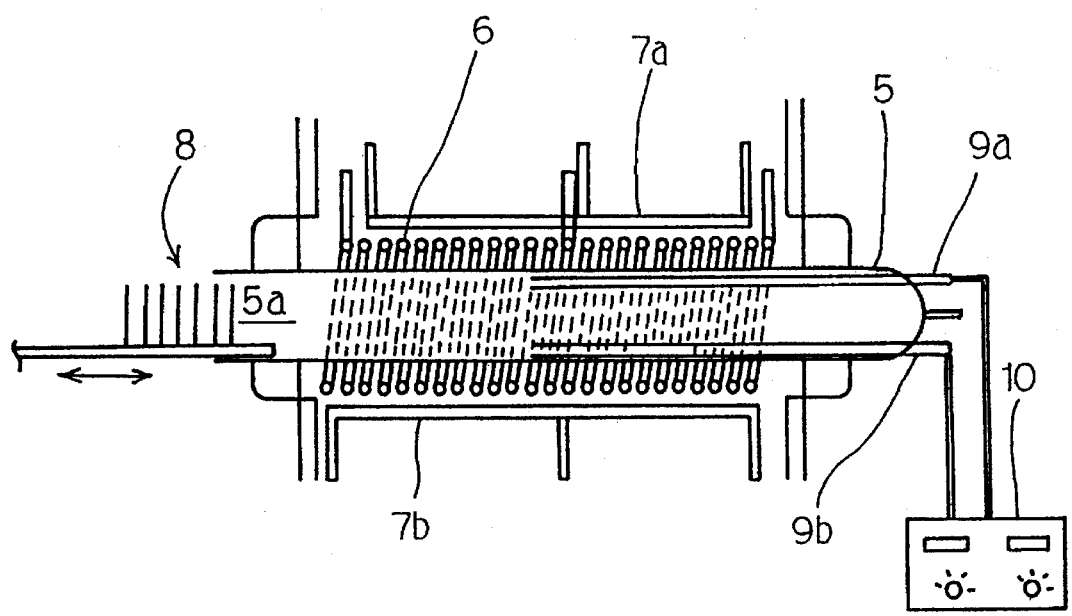
FIG. 3 is a schematic view showing the prior art diffusion furnace disclosed in Japanese Patent Publication of Unexamined Application No. 2-18928.
Figure 4:
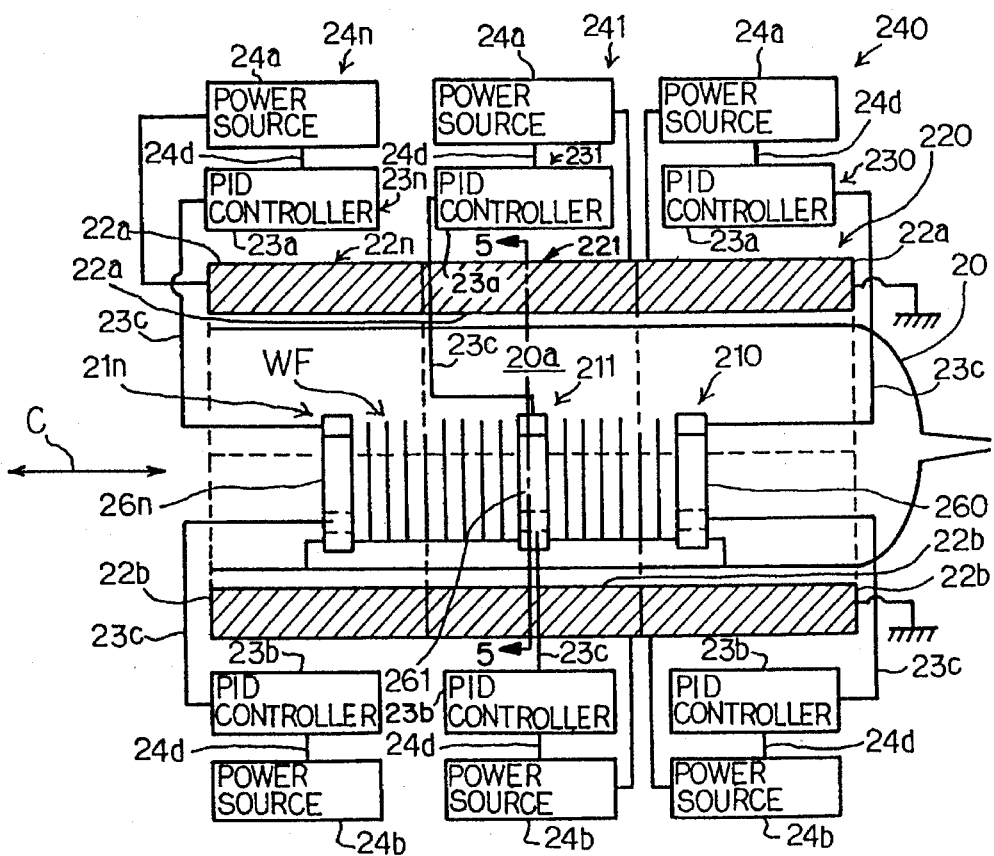
FIG. 4 is a schematic view showing a furnace according to the present invention.
Figure 5:
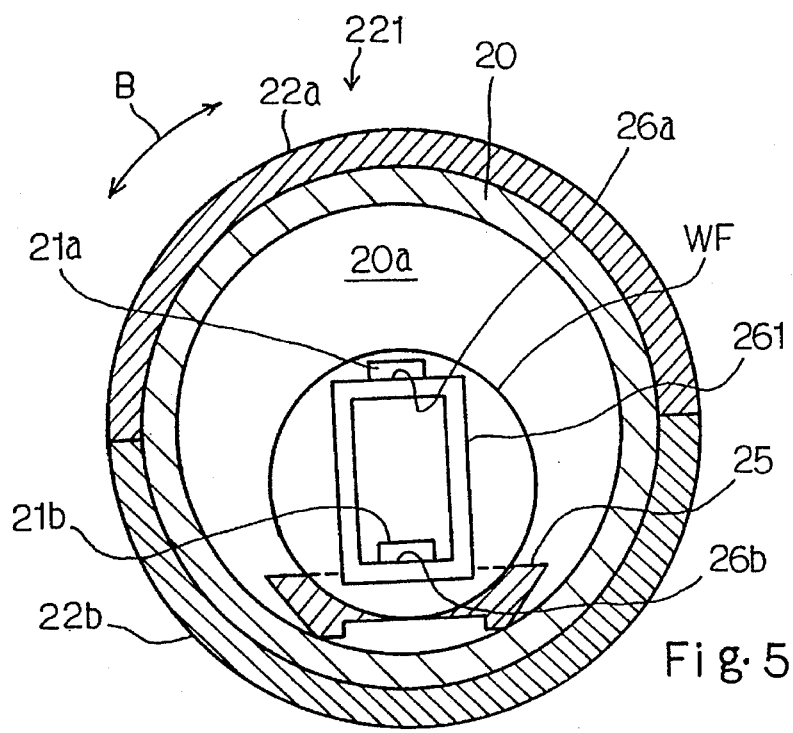
FIG. 5 is a cross sectional view taken along line 5—5 of FIG. 4 showing an inside of the furnace according to the present invention in which view the temperature sensor signal lines are not shown for the sake of simplicity.

Referring to FIGS. 4 and 5 of the drawings, a furnace embodying the present invention largely comprises a furnace tube 20, a plurality of temperature sensor groups 210 to 21n, a plurality of heater groups 220 to 22n, a plurality of controller groups 230 to 23n and a plurality of power supply groups 240 to 24n.

The furnace tube 20 encircles an inner space 20a, and the outer periphery of the furnace tube 20 extends in a direction represented by arrow B. In this instance, the direction represented by arrow B is a first direction.

A plurality of semiconductor wafers WF are mounted on a quartz boat 25, and the quartz boat 25 is moved into and out of the inner space 20a in a direction represented by arrow C. For this reason, the direction represented by arrow C is a second direction.

A plurality of rectangular sensor brackets 260 to 26n are provided on the quartz boat 25 at intervals, and two sensor positions 26a and 26b are provided on each of the rectangular sensor brackets 260 to 26n. The two sensor positions 26a and 26b are inside of the outer periphery of the semiconductor wafers WF as will be better seen from FIG. 5.

The plurality of temperature sensor groups 210 to 21n are respectively provided on the plurality of rectangular sensor brackets 260 to 26n, and two temperature sensors 21a and 21b form each of the plurality of temperature sensor groups 210 to 21n. The temperature sensors 21a and 21b are resistance temperature elements of platinum, and can discriminate 0.1 degree centigrade in a high temperature range. The temperature sensors 21a and 21b of each group are spaced in the first direction at 180 degrees, and monitor temperatures of inside zones around the semiconductor wafers WF. The temperature sensors 21a and 21b generate detecting signals each indicative of actual temperature in the inside zone being monitored.

The plurality of heater groups 220 to 22n are respectively associated with the plurality of temperature sensor groups 210 to 21n. Two heater elements 22a and 22b form each of the plurality of heater groups 220 to 22n, and the heater elements 22a and 22b of each group are respectively associated with the temperature sensors 21a and 21b of the associated temperature sensor group 210/211/21n. The heater elements 22a and 22b are held in contact with the outer surface of the furnace tube 20, and angularly spaced in the first direction as similar to the temperature sensors 21a and 21b of the associated temperature sensor group. As a result, the heater elements 22a/22b of each group mainly heat the inside zones monitored by the temperature sensors 21a and 21b of the associated temperature sensor group.

The heater elements 22a/22b are of an ohmic-resistance heating type, and all of the heater elements 22a/22b of the heater groups 220 to 22n are equal in dimensions and heat generation characteristics to one another. For this reason, the amount of heat generated by every heater element is in proportional to the current passing therethrough, and the heat supplied through the furnace tube 20 to the inner space 20a is easily estimated from the current.

The plurality of controller groups 230 to 23n are respectively associated with the plurality of temperature sensor groups 210 to 21n and, accordingly, with the heater groups 220 to 22n. Two PID (Proportional band—Integral time—Derivative time) controller units 23a and 23b form each of the plurality of controller groups 230 to 23n.

The plurality of power supply groups 240 to 24n are respectively associated with the plurality of controller groups 230 to 23n, and two power supply units 24a and 24b form each of the plurality of power supply groups 240 to 24n.

The PID controller units 23a and 23b of each controller group are connected through signal lines 23c to the temperature sensors 21a and 21b of the associated temperature sensor group 210/2111/21n and through signal lines 24d to the power supply units 24a/24b of the associated power supply group. The PID controller units 23a and 23b are responsive to the detecting signals supplied from the associated temperature sensors 21a and 21b, and instruct the associated power supply units 24a and 24b in such a manner as to match the actual temperatures to a target temperature for a uniform temperature distribution around the semiconductor wafers WF.

Thus, the PID controller units 23a and 23b and the associated power supply units 24a and 24b as a whole constitute current controlling sub-means of one of a plurality of current controlling means.

As described hereinbefore, heat generated by heater element 22a/22b is transferred to the zone monitored by the associated temperature sensor 21a/21b, and the detecting signal generated by the temperature sensor 21a/21b is supplied to the associated PID controller unit 23a/23b so as to cause the associated power source unit 24a/24b to change the amount of current supplied to the heater element 22a/22b. Thus, a plurality of feed-back loops are established in the furnace, and decrease the temperature distribution around the semiconductor wafers WF.

The PID controlling sequence is well known to a person skilled in the art, and each of the PID controller units 23a and 23b stores the target temperature. The PID controller unit 23a/23b includes a proportional band or a proportional control range with respect to the target temperature, a timer (not shown) for an integral time and a timer (not shown) for a derivative time. The integral time is given so as to eliminate offset from the target temperature in a stable range or allowed temperature range on both sides of the target temperature, and the derivative time is given for derivative action. The derivative action is expected to compensate for temperature surge entering into and coming out from the stable range.

When the semiconductor wafers WF are subjected to a diffusion or an oxidation, an operator sets the timers to appropriate values, and the semiconductor wafers WF are inserted into the furnace tube 20. The PID controller units 23a and 23b instruct the associated power source units 24a and 24b to supply the electric current. The heater elements 22a and 22b generate heat, and the heat is transferred through the furnace tube 20 to the inner space 20a. The inner space increases the actual temperatures around the semiconductor wafers WF, and the temperature sensors 21a and 21b supply the detecting signals respectively indicative of the actual temperatures to the associated PID controller units 23a and 23b. While the actual temperatures are getting closer and closer to the target temperature, the PID controller units 23a and 23b gradually decrease the electric current. Finally, the actual temperatures reach the target temperature.

If a temperature distribution takes place around the semiconductor wafers WF, some actual temperatures become different from the target temperature, and the associated PID controller units 23a/23b selectively increase and decrease the electric currents. The heater element 22a/22b supplied with much electric current increases the heat, and the heat is transferred to the zone monitored by the associated temperature sensor 21a/21b. On the other hand, the heater element 22a/22b supplied with less electric current decreases the heat, and the heat is transferred to the zone monitored by the associated temperature sensor 21a/21b. Thus, the feed-back loops minimize the temperature differences, and eliminates the temperature differences from the inner space. As a result, a uniform temperature distribution is created in the space around the semiconductor wafers WF.

In fact, when the target temperature was set to 800 degrees centigrade with a tolerance of 0.5 degree centigrade, the inner space 20a was maintained at 800 degrees centigrade ±1 degree centigrade.

As will be appreciated from the forgoing description, the feed-back loops directly control the temperature distribution around the semiconductor wafers WF, and uniform temperature distribution is created around the semiconductor wafers.

Second Embodiment

Figure 6:
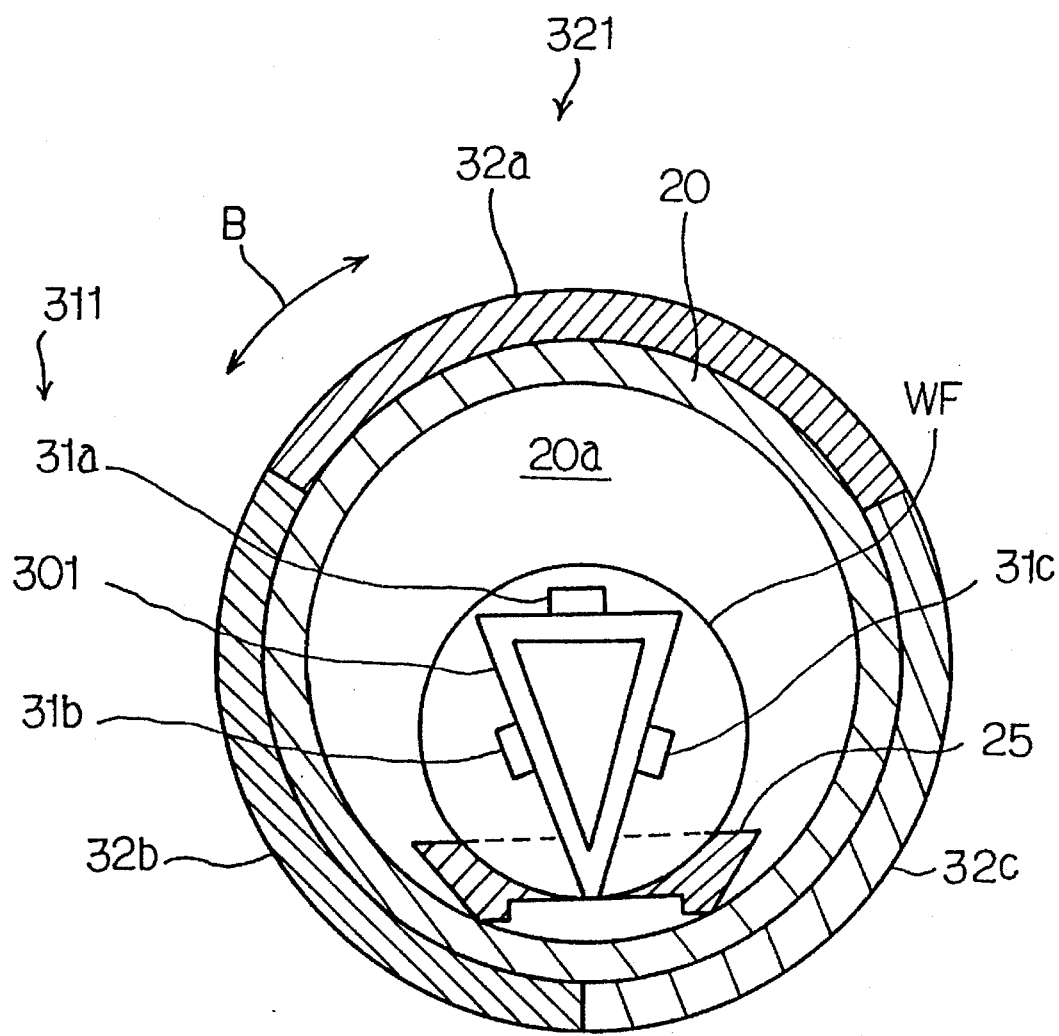
FIG. 6 is a cross sectional view showing an inside of another furnace according to the present invention.

FIG. 6 of the drawings illustrates another furnace embodying the present invention. The furnace implementing the second embodiment is similar to the first embodiment except for the number of temperature sensors of each group. For this reason, the other parts and units are labeled with the same references as those of the first embodiment.

A plurality of bracket members 301 are provided on the quartz boat 25 at intervals, and are respectively associated with a plurality of temperature sensor groups 311. In this instance, each temperature sensor group 311 is constituted by three temperature sensors 31a, 31b and 31c, and three heater elements 32a, 32b and 32c form the associated heater group 321. For this reason, the bracket member 301 is a triangle shape so as to share a zone around the semiconductor wafers WF into three sub-zones heated by the three heater elements 32a to 32c.

Although the plurality of PID controller groups and the plurality of power source groups are further incorporated in the furnace, they are similar to those of the first embodiment except for the number of the members of each group, and no further description is incorporated hereinbelow, because their functions are analogous to those from the above description.

Although particular embodiments of the present invention has been shown and described, it will be obvious to those skilled in the art that various changes and modifications may be made without departing from the spirit and scope of the present invention. For example, the temperature sensors in each group are not limited to 2 or 3, more than three temperature sensors may be incorporated in each sensor group.

What is claimed is:

1. A furnace comprising:

a furnace tube encircling an inner space in a first direction and accommodating a plurality of semiconductor wafers moved into and out of said inner space in a second direction, said plurality of semiconductor wafers being substantially aligned with one another in said second direction so as to occupy a generally cylindrical sub-space in said inner space;

a plurality of temperature sensor groups provided in said generally cylindrical sub-space and spaced apart from one another in said second direction, each of said temperature sensor groups having a plurality of temperature sensors angularly spaced from one another in said first direction adjacent outer peripheral portions of said plurality of semiconductor wafers for generating detecting signals indicative of actual temperatures in said generally cylindrical sub-space occupied by said plurality of semiconductor wafers;

a plurality of heater groups provided outside of said furnace tube and spaced from one another in said second direction, each of said plurality of heater groups having a plurality of heater elements angularly spaced from one another in said first direction around said furnace tube for supplying heat through said furnace tube to said inner space; and a plurality of current controlling means associated with said respective plurality of heater groups and said respective plurality of temperature sensor groups, each of said plurality of current controller means having a plurality of current controlling sub-means respectively responsive to said detecting signals supplied from said plurality of temperature sensors of the associated temperature sensor groups so as to regulate electric currents respectively supplied to said plurality of heater elements of the associated heater group, thereby matching said actual temperatures to a target temperature for creating a uniform temperature distribution around said plurality of semiconductor wafers.

2. The furnace as set forth in claim 1, in which said furnace tube is placed substantially horizontally.

3. The furnace as set forth in claim 1, in which said heater elements of each of said plurality of heater groups supply heats mainly to zones respectively monitored by the temperature sensors of the associated temperature sensor group.

4. The furnace as set forth in claim 1, in which each of said plurality of current controlling sub-means includes a controlling unit for generating an instruction signal through a proportional band—integral time—derivative time and a power source unit responsive to said instruction signal for regulating said electric current supplied to the associated heater element.

5. A furnace comprising:

a furnace tube encircling an inner space in a first direction and accommodating a plurality of semiconductor wafers moved into and out of said inner space in a second direction, said plurality of semiconductor wafers being substantially aligned with one another in said second direction so as to occupy a generally cylindrical sub-space in said inner space;

a plurality of temperature sensor groups provided in said inner space and arranged in said second direction, each of said temperature sensor groups having a plurality of temperature sensors arranged in said first direction adjacent outer peripheral portions of said plurality of semiconductor wafers for generating detecting signals indicative of actual temperatures in said generally cylindrical space occupied by said plurality of semiconductor wafers;

a plurality of heater groups provided outside of said furnace tube and arranged in said second direction, each of said plurality of heater groups having a plurality of heater elements arranged in said first direction around said furnace wall for supplying heat through said furnace tube to said inner space; and a plurality of current controlling means associated with said respective plurality of heater groups and said respective plurality of temperature sensor groups, each of said plurality of current controller means having a plurality of current controlling sub-means respectively responsive to said detecting signals supplied from said plurality of temperature sensors of the associated temperature sensor group so as to regulate electric currents respectively supplied to said plurality of heater elements of the associated heater group, thereby matching said actual temperatures to a target temperature for creating a uniform temperature distribution around said plurality of semiconductor wafers, and in which said plurality of semiconductor wafers are mounted on a boat, and said plurality of temperature sensor groups are respectively supported by a plurality of bracket members provided on said boat at intervals.

6. The furnace as set forth in claim 5, in which at least one of said bracket members supports one of said plurality of temperature sensor groups in a zone of said inner space between two of said plurality of semiconductor wafers.

7. The furnace as set forth in claim 6, in which the temperature sensors of one of said plurality of temperature sensor groups are two sensors spaced apart from one another in a third direction perpendicular to said second direction, said heater elements of the associated heater group being spaced in said third direction so as to mainly heat two sub-zones of said zone, respectively.

* * * * *